(12) United States Patent
Liu et al.

(10) Patent No.: US 6,169,035 B1
(45) Date of Patent: Jan. 2, 2001

(54) METHOD OF LOCAL OXIDATION USING ETCHANT AND OXIDIZER

(75) Inventors: Chuan H. Liu, Taipei; Chin-Kun Lo, Hsin Chu Hsien; Mainn-Gwo Chen, Tai Chung, all of (TW)

(73) Assignee: United Microelectronic Corp., Hsinchu (TW)

(*) Notice: Under 35 U.S.C. 154(b), the term of this patent shall be extended for 0 days.

(21) Appl. No.: 09/173,153

(22) Filed: Oct. 14, 1998

(30) Foreign Application Priority Data

Jul. 8, 1998 (TW) .................................................. 87111028

(51) Int. Cl.$^7$ .................................................. H01L 21/311
(52) U.S. Cl. .................. 438/695; 438/694; 438/706; 438/715; 438/770; 438/774; 438/443
(58) Field of Search ...................................... 438/695, 443, 438/706, 774, 439, 694, 715, 770, 759

(56) References Cited

U.S. PATENT DOCUMENTS

| | | | |
|---|---|---|---|
| 4,595,601 | * | 6/1986 | Horioka et al. ...................... 427/53.1 |
| 5,312,518 | * | 5/1994 | Kadomura ............................ 156/662 |
| 5,641,383 | * | 6/1997 | Jun ....................................... 438/695 |

* cited by examiner

*Primary Examiner*—Wael Fahmy
*Assistant Examiner*—Neal Berezny
(74) *Attorney, Agent, or Firm*—J.C. Patents; Jiawei Huang

(57) ABSTRACT

A LOCOS method uses a reagent mixed of etchant and oxidizer to simultaneously perform the step of forming the FOX layer and the step of removing a mask layer of the conventional LOCOS method. The applied temperature is about 950–1150° C. The etchant, such as a HF acid solution, is used to remove the mask layer, and the oxidizer, such as $O_2$, is used to form the FOX layer on a silicon substrate.

20 Claims, 4 Drawing Sheets

METHOD OF LOCAL OXIDATION USING ETCHANT AND OXIDIZER

CROSS-REFERENCE TO RELATED APPLICATION

This application claims the priority benefit of Taiwan application Ser. no. 87,111,028, filed Jul. 8, 1998, the full disclosure of which is incorporated herein by reference.

BACKGROUND OF THE INVENTION

1. Field of the Invention

This invention relates to a method for fabricating a semiconductor device, and more particularly to a local oxidation (LOCOS) method of forming a field oxide (FOX) structure.

2. Description of Related Art

The purpose of an isolation region in an IC device is to prevent a carrier from drifting between two adjacent device elements, such as two adjacent transistors, through a semiconductor substrate to cause leakage. For example, carriers can drift between two adjacent transistors through a common substrate if there is no isolation region between the transistors. Conventionally, isolation regions are formed between field effect transistors (FETs) in an IC device, such as a dynamic random access memory (DRAM) device, to prevent current leakage from occurring. A local oxidation (LOCOS) process is a typical isolation process widely used to form the isolation region. LOCOS technology has been well developed and it can effectively isolate the transistors or other kinds of device elements with good and reliable performance and a low fabrication cost.

FIGS. 1A–1E are cross-sectional views schematically illustrating a conventional fabrication flow of a LOCOS process to form a FOX layer. In FIG. 1A, a pad oxide layer 102 is formed over a semiconductor substrate 100 by, for example, thermal oxidation. The substrate 100 typically includes silicon. A mask layer 104 including, for example, silicon nitride is formed over the pad oxide layer 102 by, for example, lowpressure chemical vapor deposition (LPCVD).

In FIG. 1B, the mask layer 104 and the pad oxide layer 102 are patterned by, for example, photolithography and etching to form an opening 101 in order to expose the substrate 100. The region other than the opening 101 is an active region. The purpose of the opening 101 is to form an isolating structure therein.

In FIG. 1C, an wet oxidation process with water vapor is performed to oxidize the exposed semiconductor substrate 100 within the opening 101 so that a field oxide (FOX) layer 106 is formed in the opening 101. Since the mask layer 104 is made of silicon nitride, it effectively resists $H_2O$ or $O_2$ molecules in a high temperature environment. A portion of the substrate surface covered by the mask layer 104 is not oxidized but a bird's beak structure 108 forms at the edge of the opening 101. A silicon nitride spot 110 due to a reaction on the silicon substrate 100 may form around the bird's beak structure 108. Details of how the spot is formed are described later. In FIG. 1D, the mask layer 104 is removed by, for example, heated phosphoric acid or fluorine ion plasma. In FIG. 1E, the pad oxide layer 102 is removed by, for example, wet etching with HF acid solution.

However, the conventional LOCOS process still has some problems. In the above description, the formation of the bird's beak structure 108 shown in FIG. 1C forms because $H_2O$ and $O_2$ molecules can horizontally diffuse at the edges of the opening 101. The mask layer 104 cannot resist horizontal diffusion. An oxidation along a horizontal inner forward direction continues to occur at the edge even though the oxidation phenomenon gradually decreases. This is why a bird's beak structure is formed. The bird's beak structure induces a tensile stress on the substrate 100 at its contact portion, where dislocation of silicon crystal cells occurs to cause a leakage current. Moreover, the bird's beak structure 108 also consumes the effective active region. The integration of an integrated circuit device is thereby limited.

Furthermore, during thermal oxidation to form the bird's beak structure, $H_2O$ molecules can react with the silicon nitride to form $NH_3$ molecules. If the bird's beak structure extends farther, $NH_3$ molecules have a higher probability of diffusing along the edge of the bird's beak structure and even may diffuse through the oxide layer 102 to react with the silicon substrate 100. This results in formation of the localized silicon nitride spot 110 on the surface of the substrate 100. Since silicon nitride is usually used as a mask for growing oxide, the silicon nitride spot 110 behaves as a micro-oxidation masking layer. When a gate oxide layer (not shown) is subsequently formed over the active region, the gate oxide layer below or around the micro-oxidation masking layer becomes thinner. This thinner portion of the gate oxide layer appears as a white ribbon structure under a photo-microscope, so that this phenomenon is called the white ribbon phenomenon. The white ribbon phenomenon reduces the charge trapping capability of the gate oxide layer and the oxide breakdown phenomenon therefore occurs earlier. This seriously undermines the long-term reliability of the gate oxide layer.

SUMMARY OF THE INVENTION

It is therefore an objective of the present invention to provide a local oxidation (LOCOS) method, which can reduce the occurrence of the bird's beak structure on the field oxide (FOX) layer. This allows the effective active region to be increased and the leakage current is effectively avoided.

It is another an objective of the present invention to provide a local oxidation (LOCOS) method, which can reduce the extension of the bird's beak structure so as to reduce the white ribbon phenomenon, thereby ensuring the long-term reliability of the subsequently formed gate oxide layer.

It is still another an objective of the present invention to provide a local oxidation (LOCOS) method, which can simultaneously form a FOX layer and remove a mask layer so that the LOCOS method reduces the procedure by one step.

In accordance with the foregoing and other objectives of the present invention, a LOCOS method uses a reagent mixed of etchant and oxidizer to simultaneously perform the step of forming the FOX layer and the step of removing mask layer of the conventional LOCOS method. The applied temperature is about 950–1150° C. In the LOCOS method of the invention. the length of the bird's beak structure is reduced to avoid all related problems such as the occurrence of the white ribbon phenomenon. The bird's beak structure may even be completely eliminated. The etchant is used to remove the mask layer, and the oxidizer is used to form the FOX layer on a silicon substrate.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1A:
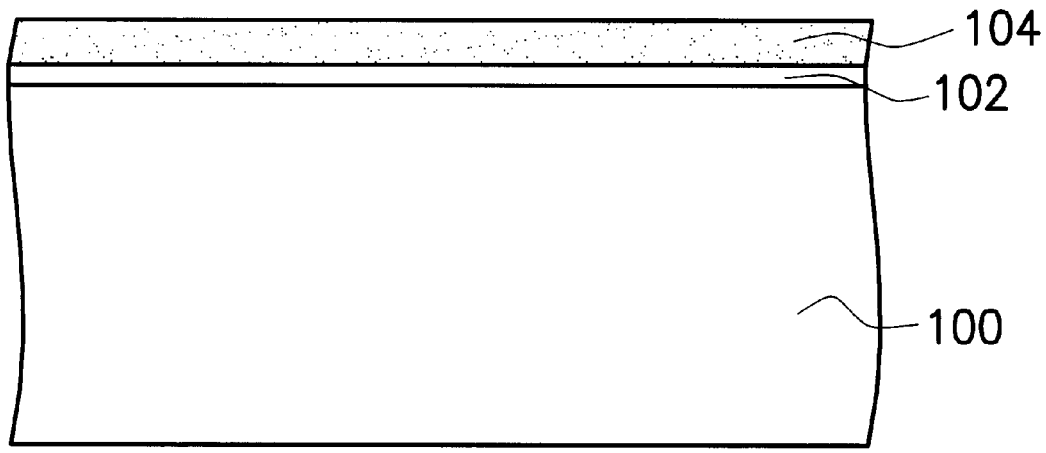
FIGS. 1A–1E are cross-sectional views schematically illustrating a conventional fabrication flow of a LOCOS process to form a FOX layer.
Figure 1B:
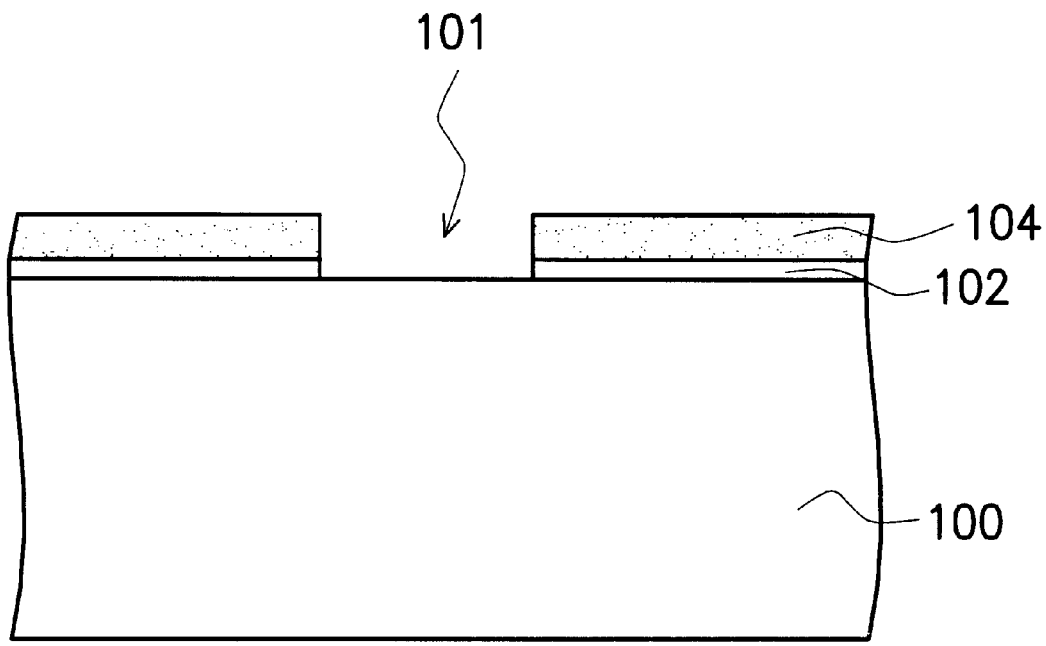
Figure 1C:
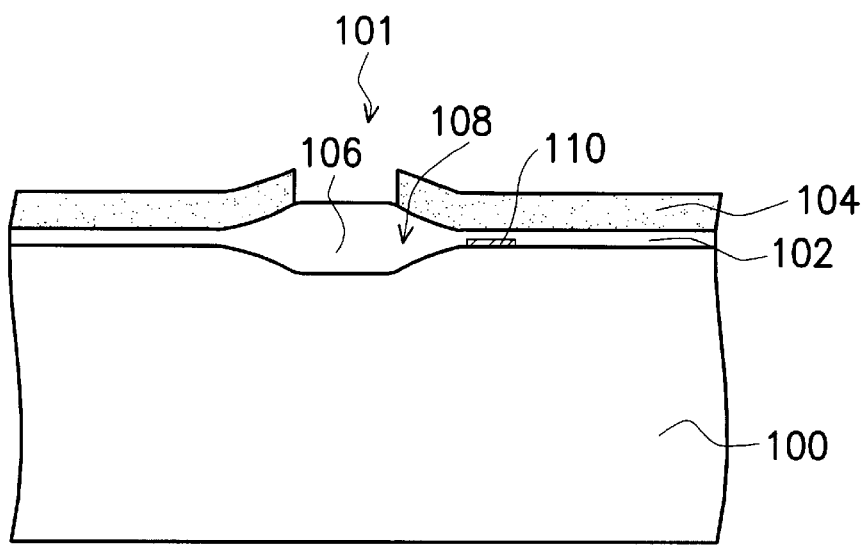
Figure 1D:
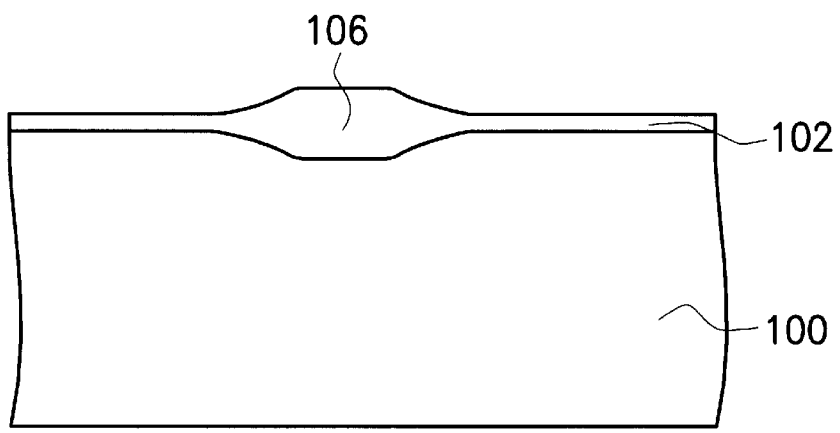
Figure 1E:
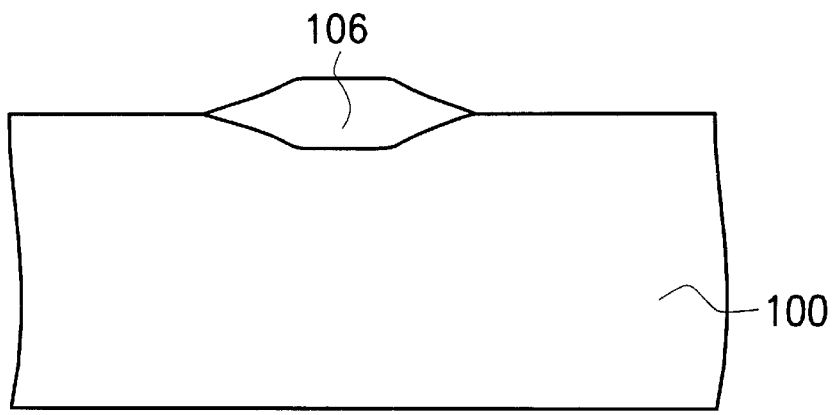
Figure 2A:
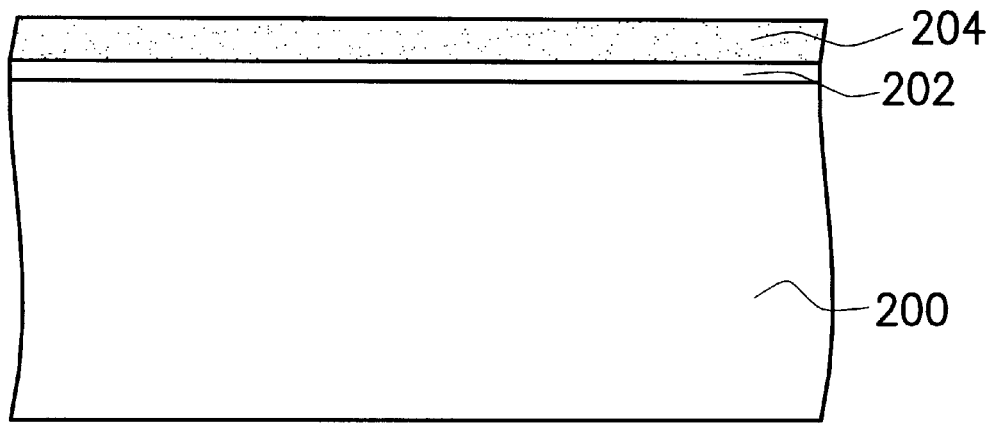
FIGS. 2A–2D are cross-sectional views schematically illustrating a fabrication flow of a LOCOS process to form a FOX layer, according to a preferred embodiment of the invention.

FIGS. 2A–2D are cross-sectional views schematically illustrating a fabrication flow of a LOCOS process to form a FOX layer, according to a preferred embodiment of the invention. In FIG. 2A. a pad oxide layer 202 is formed over a semiconductor substrate 200 by. for example, thermal oxidation. The substrate 200 typically includes silicon. A mask layer 204 including, for example, silicon nitride is formed over the pad oxide layer 202 by, for example, low-pressure chemical vapor deposition (LPCVD).

Figure 2B:
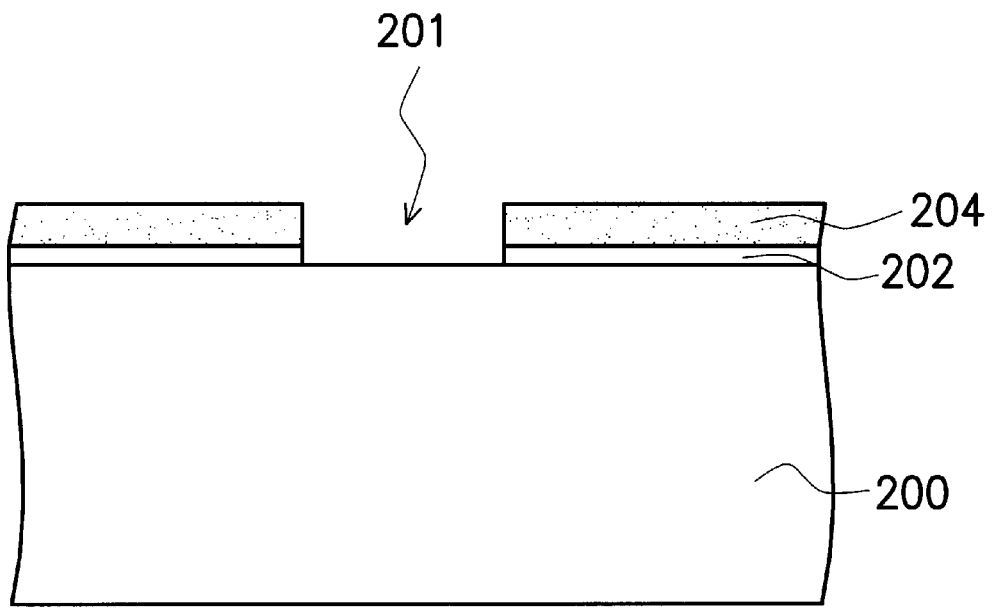

In FIG. 2B, the mask layer 204 and the pad oxide layer 202 are patterned by, for example, photolithography and etching to form an opening 201 in order to expose the substrate 200. The region other than the opening 201 is an active region. The purpose of the opening 201 is to form an isolating structure therein.

Figure 2C:
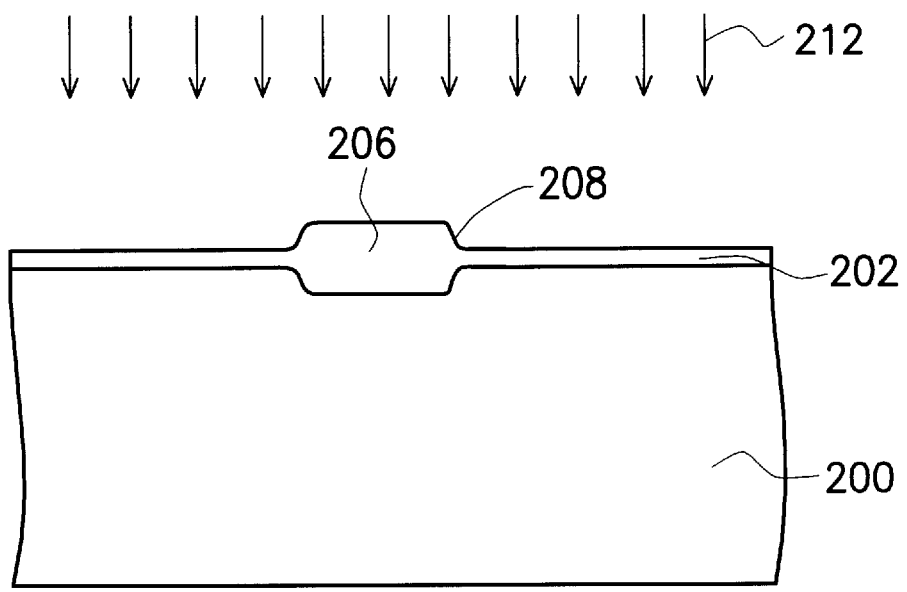
Figure 2D:
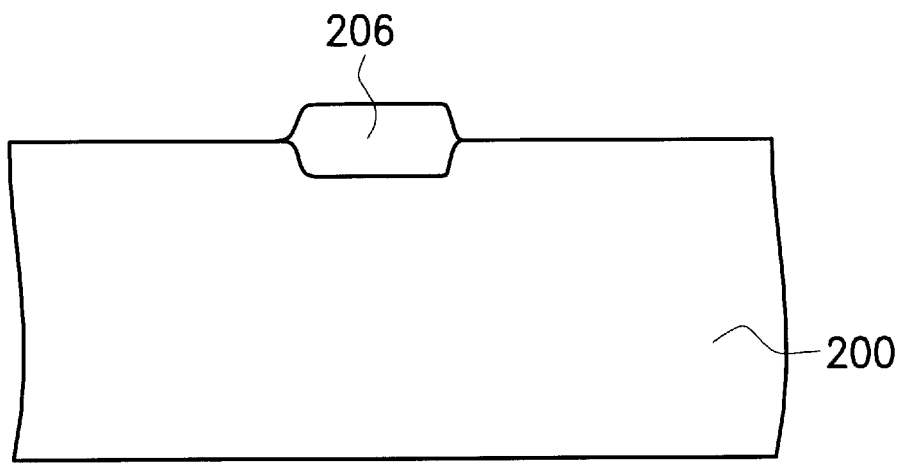

In FIG. 2B and FIG. 2C, in an environment at a temperature of about 950–1150° C., a reagent 212 mixed from an etchant and an oxidizer is flushed onto the substrate 200. The oxidizer allows a FOX layer 206 to be formed on the substrate 200 around the region of the opening 201. During formation of the FOX layer 206, the mask layer 204 is simultaneously removed due to etchant. The preferred temperature is about 1100° C. The oxidizer does not react with the etchant. The oxidizer includes, for example, $O_2$, ozone ($O_3$), or hydrogen peroxide ($H_2O_2$), in which $O_3$ is decomposed into O-base and $O_2$ in the high temperature environment, and $H_2O_2$ is decomposed into water vapor and O-base in the high temperature environment. The etchant used to remove the mask layer 204 includes, for example, phosphoric acid ($H_3PO_4$), HF, $SF_6$, $CHF_3$, or $CF_4$, in which preferably $SF_6$ is diluted. In FIG. 2D, the pad oxide layer 202 is removed by, for example, etching with an etchant of HF acid solution.

Since the FOX layer 206 is rapidly formed in the high temperature environment, the horizontal diffusion of the oxidizer at the edge of the FOX layer, causing horizontal oxidation, is reduced so that the length of a bird's beak structure 208 is reduced. Moreover, since the applied temperature is at least about 950° C., which is higher than the soft point temperature (Ts) of silicon oxide, the silicon oxide of the FOX layer 206 is in a lava-like status during forming process. In addition, the mask layer 204 is gradually thinned due to the etchant. The bird's beak structure 208 may therefore be prevented from occurring. The tensile stress between the edge of the FOX layer 206 and the substrate 200 is accordingly reduced.

In conclusion, the invention includes several characteristics as follows:

1. The step of forming the FOX layer 206 and the step of removing the mask layer 204 are simultaneously performed so that the fabrication process is reduced by one step.
2. The FOX layer 206 is formed at a temperature of about 950–1150° C., which is higher than the soft point of silicon oxide so that the length of the bird's beak structure is reduced or may be completely avoided. Therefore, the white ribbon phenomenon is avoided to ensure the long-term reliability of the gate oxide layer.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A local oxidation (LOCOS) method comprising:

forming a mask layer over a semiconductor substrate and patterning the mask layer to form an opening, which exposes the substrate; and simultaneously forming a field oxide (FOX) layer on the exposed portion of the substrate and removing the mask layer by a reagent mixed of an oxidizer and an etchant in a high temperature environment in a range of about 950° C. to about 1150° C.

2. The method of claim 1, wherein the mask layer comprises silicon nitride.

3. The method of claim 2, wherein before the step of forming the mask layer, a pad oxide layer is formed over the substrate such that the pad oxide is also patterned to form the opening.

4. The method of claim 1, wherein the oxidizer and the etchant of the reagent have no reaction to each other.

5. The method of claim 4, wherein the oxidizer of the reagent comprises $O_2$, $O_3$, or $H_2O_2$.

6. The method of claim 4, wherein the etchant of the reagent comprises $H_3PO_4$, HF, $SF_6$, $CHF_3$, or $CF_4$.

7. The method of claim 1, wherein the high temperature environment comprises a temperature of about 1100° C.

8. The method of claim 1, wherein the opening is formed by photolithography and etching.

9. A local oxidation (LOCOS) method comprising:

sequentially forming a pad oxide layer and a mask layer over a semiconductor substrate;

patterning the pad oxide layer and the mask layer to form an opening, which exposes the substrate;

simultaneously forming a field oxide (FOX) layer on the exposed portion of the substrate and removing the mask layer by a reagent mixed of an oxidizer and an etchant in a high temperature environment in a range of about 950° C. to about 1150° C.; and removing the pad oxide.

10. The method of claim 9, wherein the high temperature environment comprises a temperature of about 1100° C.

11. The method of claim 9, wherein the oxidizer of the reagent comprises $O_2$.

12. The method of claim 9, wherein the oxidizer of the reagent comprises $O_3$.

13. The method of claim 9, wherein the oxidizer of the reagent comprises $H_2O_2$.

14. The method of claim 9, wherein the etchant of the reagent comprises $H_3PO_4$.

15. The method of claim 9, wherein the etchant of the reagent comprises HF.

16. The method of claim 9, wherein the etchant of the reagent comprises $SF_6$.

17. The method of claim 9, wherein the etchant of the reagent comprises $CHF_3$.

18. The method of claim 9, wherein the etchant of the reagant comprises $CF_4$.

19. A local oxidation (LOCOS) method comprising:

forming a mask layer over a semiconductor substrate and patterning the mask layer to form an opening, which exposes the substrate; and simultaneously forming a field oxide (FOX) layer on the exposed portion of the substrate and removing the mask layer by flushing a reagent on the substrate at a temperature of higher than about 1000° C. but lower than about 1150° C., wherein the reagent comprises an oxidizer and an etchant and the etchant is $SF_6$ or HF.

20. The method of claim 19, wherein before the step of forming the mask layer, a pad oxide layer is formed over the substrate such that the pad oxide is also patterned to form the opening.

* * * * *